United States Patent
Roy et al.

(10) Patent No.: US 7,777,289 B2
(45) Date of Patent: Aug. 17, 2010

(54) INTEGRATED PHOTODIODE OF THE FLOATING SUBSTRATE TYPE

(75) Inventors: François Roy, Seyssins (FR); Arnaud Tournier, Grenoble (FR)

(73) Assignee: STMicroelectronics S.A., Montrouge (FR)

( * ) Notice: Subject to any disclaimer, the term of this patent is extended or adjusted under 35 U.S.C. 154(b) by 695 days.

(21) Appl. No.: 11/432,678

(22) Filed: May 10, 2006

(65) Prior Publication Data

US 2006/0258042 A1  Nov. 16, 2006

(30) Foreign Application Priority Data

May 13, 2005  (FR) .................................. 05 04836

(51) Int. Cl.
H01L 27/146 (2006.01)
(52) U.S. Cl. ................ 257/446; 257/292; 257/E27.133
(58) Field of Classification Search ................ 257/292, 257/446, E27.133
See application file for complete search history.

(56) References Cited

U.S. PATENT DOCUMENTS

| | | | |
|---|---|---|---|
| 4,517,719 | A | 5/1985 | Okumura et al. |
| 5,000,555 | A | 3/1991 | Sato .......................... 350/530 |
| 6,096,616 | A | 8/2000 | Nistler et al. |
| 6,642,561 | B2 | 11/2003 | Kakumoto et al. |
| 6,771,416 | B2 | 8/2004 | Takahama et al. ........... 359/363 |
| 6,888,195 | B2 | 5/2005 | Saito et al. |
| 2001/0015468 | A1 | 8/2001 | Miida |
| 2002/0024071 | A1 | 2/2002 | Kawajiri et al. |
| 2003/0090789 | A1 | 5/2003 | Herz et al. ................... 359/368 |
| 2004/0017496 | A1 | 1/2004 | Koizumi et al. |
| 2004/0094784 | A1 | 5/2004 | Rhodes et al. |
| 2004/0173824 | A1* | 9/2004 | Nagasaki et al. ............ 257/255 |
| 2004/0201047 | A1 | 10/2004 | Takamura |
| 2004/0206991 | A1 | 10/2004 | Yato |
| 2005/0023553 | A1 | 2/2005 | Rhodes |
| 2006/0186505 | A1* | 8/2006 | Adkisson et al. ............ 257/463 |
| 2006/0244090 | A1 | 11/2006 | Roy et al. |
| 2006/0255371 | A1* | 11/2006 | Roy et al. ................... 257/223 |
| 2006/0258042 | A1 | 11/2006 | Roy et al. |
| 2007/0090424 | A1* | 4/2007 | Lim ........................... 257/292 |

FOREIGN PATENT DOCUMENTS

DE  4231470  3/1994

(Continued)

OTHER PUBLICATIONS

Machine English translation of JP2001-053260.*

(Continued)

Primary Examiner—Leonardo Andújar
Assistant Examiner—Christopher M Roland
(74) Attorney, Agent, or Firm—Gardere Wynne Sewell LLP

(57) ABSTRACT

An integrated circuit includes at least one photodiode of the floating substrate type which is associated with a read transistor. The photodiode is formed from a buried layer lying beneath the floating substrate and an upper layer lying on the floating substrate. The upper layer incorporates the source and drain regions of the read transistor. The source and drain regions are produced on either side of the gate of the read transistor. An isolating trench is located alongside the source region and extends from the upper surface of the upper layer down to below the buried layer, so as to isolate the source region from said buried layer.

20 Claims, 15 Drawing Sheets

FOREIGN PATENT DOCUMENTS

| | | |
|---|---|---|
| DE | 29804776 | 5/1998 |
| DE | 10051299 | 4/2002 |
| DE | 10106275 | 4/2002 |
| DE | 69621540 T | 1/2003 |
| EP | 1 517 375 A2 | 3/2005 |

OTHER PUBLICATIONS

Patent Abstracts of Japan, vol. 2003, No. 11, Nov. 5, 2003; and JP 2003 188367, Jul. 4, 2003.

Patent Abstracts of Japan, vol. 2000, No. 19, Jun. 5, 2000; and JP 2001 053260 A, Feb. 23, 2001.

Miida, et al., "A 1.5MPixel imager with localized hole modulation method," Solid-State Circuits Conference, 2002, Digest of Technical Paper, 2000, IEEE International, Feb. 3-7, 2002, Piscataway, NJ, USA, IEEE, vol. 1, 2002, pp. 42-442, XP 010585455, ISBN: 0-7803-7335-9.

Hynecek, J., "BCMD—An Improved Photosite Structure for High-Density Image Sensors," IEEE Transactions on Electron Devices, vol. 38, No. 5, May 1991. IEEE Log No. 9143222.

Preliminary French Search Report, FR 0504836, dated Nov. 18, 2005.

Patent Abstracts of Japan, vol. 2003, No. 08, Aug. 6, 2003; and JP 2003 124497 A (Shirinkusu KK), Apr. 25, 2003.

Patent Abstracts of Japan, vol. 2003, No. 12, Dec. 5, 2003; and JP 2004 187017 A (Innotech corp:), Jul. 2, 2004.

Leica DM4000B, 2003.

Leica DM5000B, 2003.

\* cited by examiner

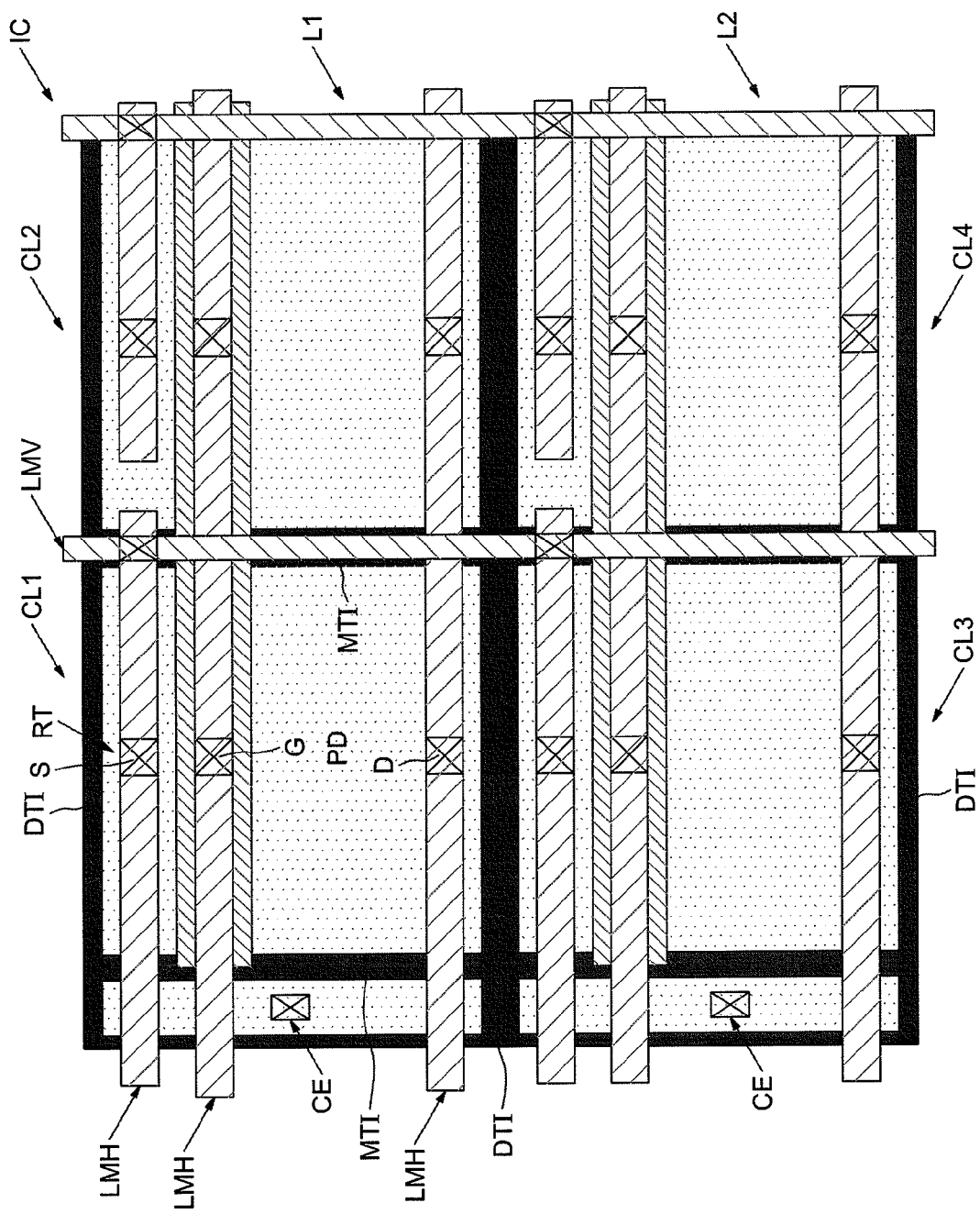

INTEGRATED PHOTODIODE OF THE FLOATING SUBSTRATE TYPE

PRIORITY CLAIM

The present application claims priority from French Application for Patent No. 05 04836 filed May 13, 2005, the disclosure of which is hereby incorporated by reference.

BACKGROUND OF THE INVENTION

1. Technical Field of the Invention

The present invention relates to microelectronics, and especially to integrated circuits comprising photodiodes.

2. Description of Related Art

Image sensors based on semiconductor components advantageously rely on the principle of photons being converted into electron/hole pairs in silicon. More precisely, the charges created in photosensitive regions are stored in the photodiode and are then read by an electronic system. This electronic system, which controls the photodiode, comprises in particular a read transistor for converting the charges stored in the photodiode into an electrical quantity.

The invention applies advantageously but without limitation to CMOS image sensors and more particularly to VMIS sensors (Vth modulation image sensors) which are image sensors that rely on the modulation of the threshold voltage of an MOS transistor. The reader may refer on this subject to the article by Takashi Miida et al., "A 1.5 Mpixel Imager with Localized Hole Modulation Method", ISSCC Dig. Tech. Pap., pp. 42-43, July 2002.

This type of CMOS transistor consists of a buried photodiode associated with a single slightly modified MOS transistor, owing to the fact that its substrate is a floating substrate, that is to say its potential can only be reached via an electrode, for example. This floating substrate acts as a charge storage region during charge integration, that is to say when the incident light generates electron/hole pairs in the photosensitive regions.

More generally, the invention may apply to any photodiode of the floating substrate type.

Conventionally, photodiodes of the floating substrate type provide the isolation between the various pixels of an image sensor by producing a read transistor in which the gate is of circular type as opposed to rectangular type. This is because, to completely isolate the floating substrate, it is necessary to surround it with a semiconductor region of opposite type to it, while preventing the source and drain from being short-circuited. It is therefore imperative to use photodiodes having a gate with a circular structure, in which the buried layer of the photodiode is connected to the drain but the source is isolated from the buried layer by the gate of the read transistor that surrounds it.

However, devices possessing this type of structure with round-gate read transistors are very bulky.

Although CMOS image sensors in which a single read transistor is needed per pixel do make it possible for the area of the integrated circuit to be greatly reduced, the use of a transistor with a circular/round gate cancels out the saving made in terms of area. In this case, a pixel associated with a circuit comprising a photodiode and a circular-gate read transistor has as large a footprint as a pixel associated with a conventional circuit comprising a photodiode and four transistors.

There is a need to provide a solution to this problem.

SUMMARY OF THE INVENTION

The present invention proposes an integrated circuit for CMOS image sensors in which each pixel is associated only with a single read transistor, while still having a minimal footprint.

For this purpose, according to a first aspect, the invention provides an integrated circuit comprising at least one photodiode of the floating substrate type, associated with a read transistor, said photodiode comprising a buried layer lying beneath the floating substrate and an upper layer lying on the floating substrate and incorporating the source and drain regions.

According to a general feature of this first aspect of the invention, the source and drain regions are produced on either side of the gate of the read transistor. Furthermore, the circuit includes an isolating trench located alongside said source region and extending from the upper surface of the upper layer down to below the buried layer, so as to isolate the source region from said buried layer.

In other words, the invention makes it possible to produce an integrated circuit comprising both a photodiode of the floating substrate type and a rectangular gate, the source and drain of the transistor being produced on either side of this gate.

Consequently, the invention makes it possible to produce image sensors in which each pixel can be associated only with a single read transistor, which image sensors have a minimal footprint.

Furthermore, the circuit may advantageously include a semiconductor contact region of the same conductivity type as the buried layer and electrically isolated from the upper layer, said contact region extending between the upper surface of the upper layer and the buried layer.

This semiconductor contact region allows the buried layer of the photodiode to be biased independent of the drain region.

The circuit may include a first auxiliary isolating trench lying between the drain region of the transistor and the photodiode and passing through said upper layer.

This first auxiliary isolating trench has the advantage of further reducing the area of the integrated circuit, when it is produced on silicon.

If the integrated circuit includes a first auxiliary isolating trench and a semiconductor contact region of the same conductivity type as the buried layer and electrically isolated from the upper layer, it may further include a second auxiliary isolating trench lying between the photodiode and said semiconductor contact region, and passing through said upper layer.

As a variant, when the integrated circuit includes a semiconductor contact region of the same conductivity type as the buried layer and electrically isolated from the upper layer, it may further include an auxiliary isolating trench lying between the photodiode and the semiconductor contact region and extending from the upper surface of the upper layer down to below the buried layer.

According to another aspect, the invention proposes an integrated circuit comprising several sets of photodiodes associated with read transistors, as defined above.

According to another aspect, the invention proposes an image sensor comprising an integrated circuit according to any one of the embodiments defined above, each photodiode/transistor set defining a pixel of the sensor.

In accordance with an embodiment of the invention, an integrated circuit comprises a plurality of photodiodes, each photodiode of the floating substrate type comprising a buried layer lying beneath a floating substrate and an upper layer lying on the floating substrate. A read transistor is associated with each photodiode and includes source and drain regions incorporated into the upper layer and produced on either side of a gate of the read transistor. A first isolating trench is located alongside said source region of each read transistor and extends from an upper surface of the upper layer down to below the buried layer, so as to isolate the source region from said buried layer.

In accordance with another embodiment, an integrated circuit comprises a photodiode of the floating substrate type comprising a buried layer lying beneath a floating substrate and an upper layer lying on the floating substrate, the upper layer including a first and second portions. A read transistor is associated with the photodiode and includes source and drain regions incorporated into the first portion of the upper layer and produced on either side of a gate of the read transistor. A first trench isolation structure extends through the upper layer and into the floating substrate, the first trench isolation structure dividing the upper layer into the first and second portions.

In accordance with another embodiment, an integrated circuit comprises a photodiode of the floating substrate type comprising a buried layer lying beneath a floating substrate and an upper layer lying on the floating substrate, the upper layer including a first and second portions. A read transistor is associated with the photodiode and includes source and drain regions incorporated into the first portion of the upper layer and produced on either side of a gate of the read transistor. A first trench isolation structure extends through the upper layer and into the floating substrate, the first trench isolation structure dividing the upper layer into the first and second portions. A semiconductor contact region of a same conductivity type as the buried layer extends down to contact with the buried layer. A second trench isolation structure extends through the upper layer and into the floating substrate, the second trench isolation structure dividing the second portion of the upper layer from the semiconductor contact region.

In accordance with another embodiment, an integrated circuit comprises a photodiode of the floating substrate type comprising a buried layer lying beneath a floating substrate and an upper layer lying on the floating substrate, the upper layer including a first and second portions. A read transistor is associated with the photodiode and includes source and drain regions incorporated into the first portion of the upper layer and produced on either side of a gate of the read transistor. A semiconductor contact region of a same conductivity type as the buried layer extends down to contact with the buried layer. A first trench isolation structure extends through the upper layer and floating substrate at least to an upper surface of the buried layer, the first trench isolation structure separating the second portion of the upper layer from the semiconductor contact region.

BRIEF DESCRIPTION OF THE DRAWINGS

A more complete understanding of the method and apparatus of the present invention may be acquired by reference to the following Detailed Description when taken in conjunction with the accompanying Drawings wherein:

FIGS. 14 and 15 show various examples of embodiments of an integrated circuit according to the invention produced on silicon.

DETAILED DESCRIPTION OF THE PREFERRED EMBODIMENTS

Figure 1:
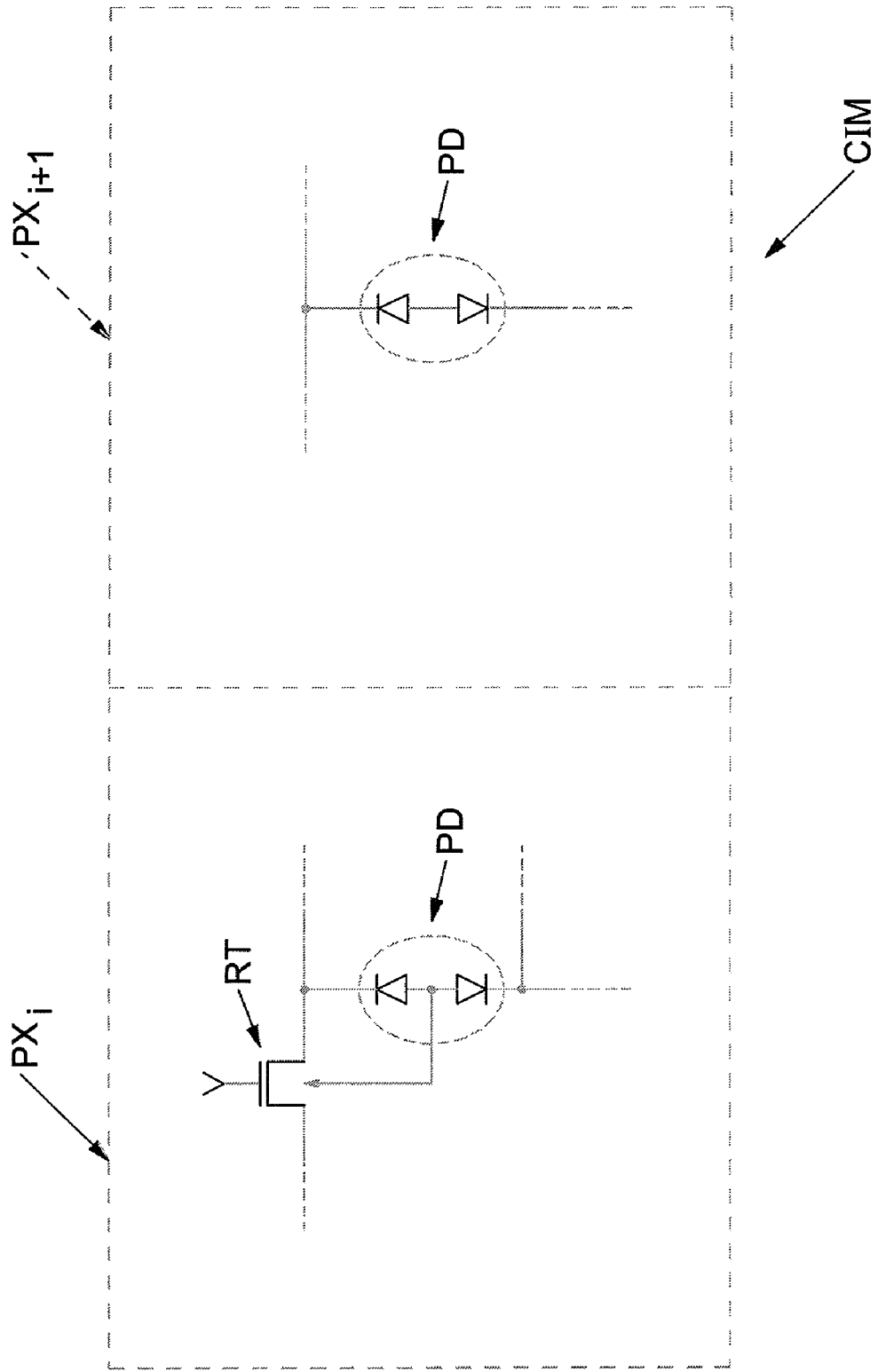
FIG. 1 illustrates schematically an image sensor according to the invention formed from several cells, the sensor being equipped with photodiodes according to the invention.

In FIG. 1, the reference IS denotes in general an image sensor formed from a matrix of cells (or pixels) $PX_i$, each comprising a photodiode PD and a read transistor RT connected to the photodiode PD. Each cell $PX_i$ may include additional control means connected to the read transistor RT, for example a reset transistor, a select transistor and a follower transistor.

Figure 2:
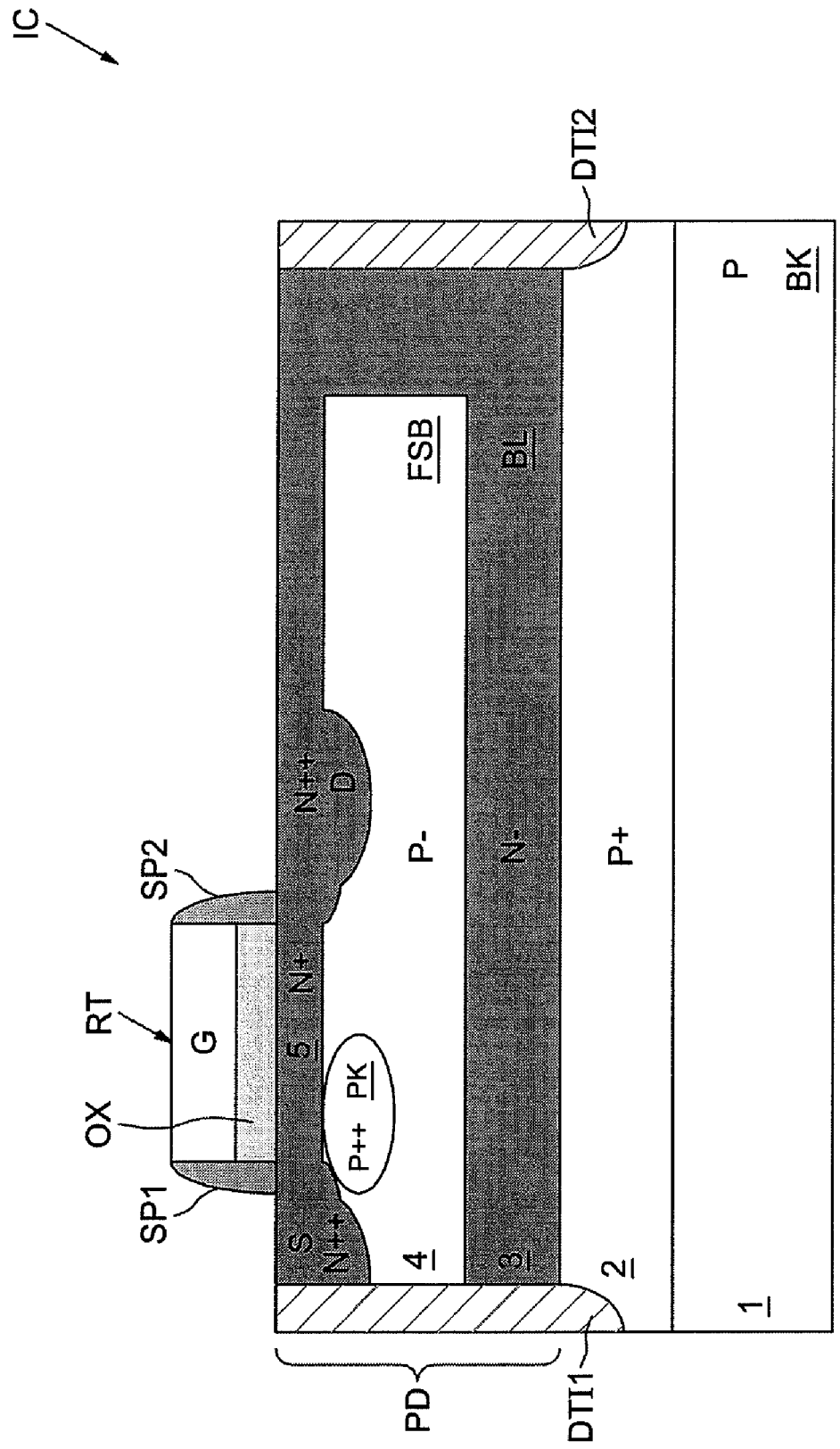
FIG. 2 shows one embodiment of an integrated circuit according to the invention.

FIG. 2 shows in greater detail the semiconductor structure of the photodiode PD of a cell $PX_i$.

The reference IC denotes an integrated circuit according to a first embodiment of the invention, comprising the photodiode PD above a layer 1 of substrate or bulk BK, which here is p-doped and constitutes the support for the integrated circuit IC.

The integrated circuit also includes a $p^+$-doped layer 2 between the support layer 1 and the photodiode PD. The role of this layer 2 will be described in greater detail later.

The circuit IC includes a stack of semiconductor layers 3, 4 and 5 that are located above the layer 2 and form the photodiode PD.

This stack comprises a semiconductor layer 3, here n-doped, above the $p^+$-doped layer 2. The layer 3 forms a buried layer BL, that is to say a barrier for the charges photogenerated in the photosensitive region of the photodiode PD.

The buried layer BL is surmounted by a region 4, called floating substrate FSB, that is to say a closed region whose potential can be modified or reached only using for example an electrode.

The floating substrate region FSB includes, in this example, a $p^{++}$-overdoped storage area or pocket PK. This is because instead of storing the photogenerated charges in the entire floating substrate FSB, they are stored in the pocket PK. However, this embodiment may also apply to photodiodes comprising a floating substrate with no pockets.

The photodiode PD includes an upper layer 5, here n-doped, so that the floating substrate region is entirely surrounded by semiconductor material of opposite conductivity type, except on one side, as described below.

On top of the upper layer 5 is the read transistor RT. This comprises a gate G produced on top of an oxide layer OX. Furthermore, here there are two spacers SP1 and SP2 on each side of the gate.

The $n^{++}$-doped source and drain S and D are produced on either side of the rectangular gate in a first portion of the upper layer 5.

Given that the gate of the read transistor RT is a gate of rectangular structure and that the floating substrate is surrounded with n-type semiconductor material, an isolating trench DTI1 is produced so as to isolate the upper layer and especially the n-doped source from the buried layer BL.

The trench DTI1 is of the deep trench isolation type. Specifically, this trench extends from the upper surface of the upper layer 5 down to below the buried layer BL so as to isolate the buried layer BL from the upper layer 5.

Moreover, the width of this trench DTI1 is particularly narrow owing to the existence of the $p^+$-doped layer 2, which makes it possible to control the depth of the buried layer BL and consequently to have shallower isolating trenches.

This is because the deeper the trench, the larger the area of the integrated circuit. Thus, the existence of the layer 2 allows the depth of the trench DTI1 to be reduced and consequently allows the area of the integrated circuit produced on silicon to be optimized.

The isolating trench DTI1 is therefore deep enough to isolate the buried layer BL from the upper layer 5 and narrow enough to be compatible with the production of compact integrated circuits.

Another deep isolating trench DTI2 is produced so as to isolate the integrated circuit and consequently the pixel associated with it, from another integrated circuit, which is adjacent to it in the case of an image sensor CIM comprising a matrix with several pixels, as shown in FIG. 1.

Figure 3:
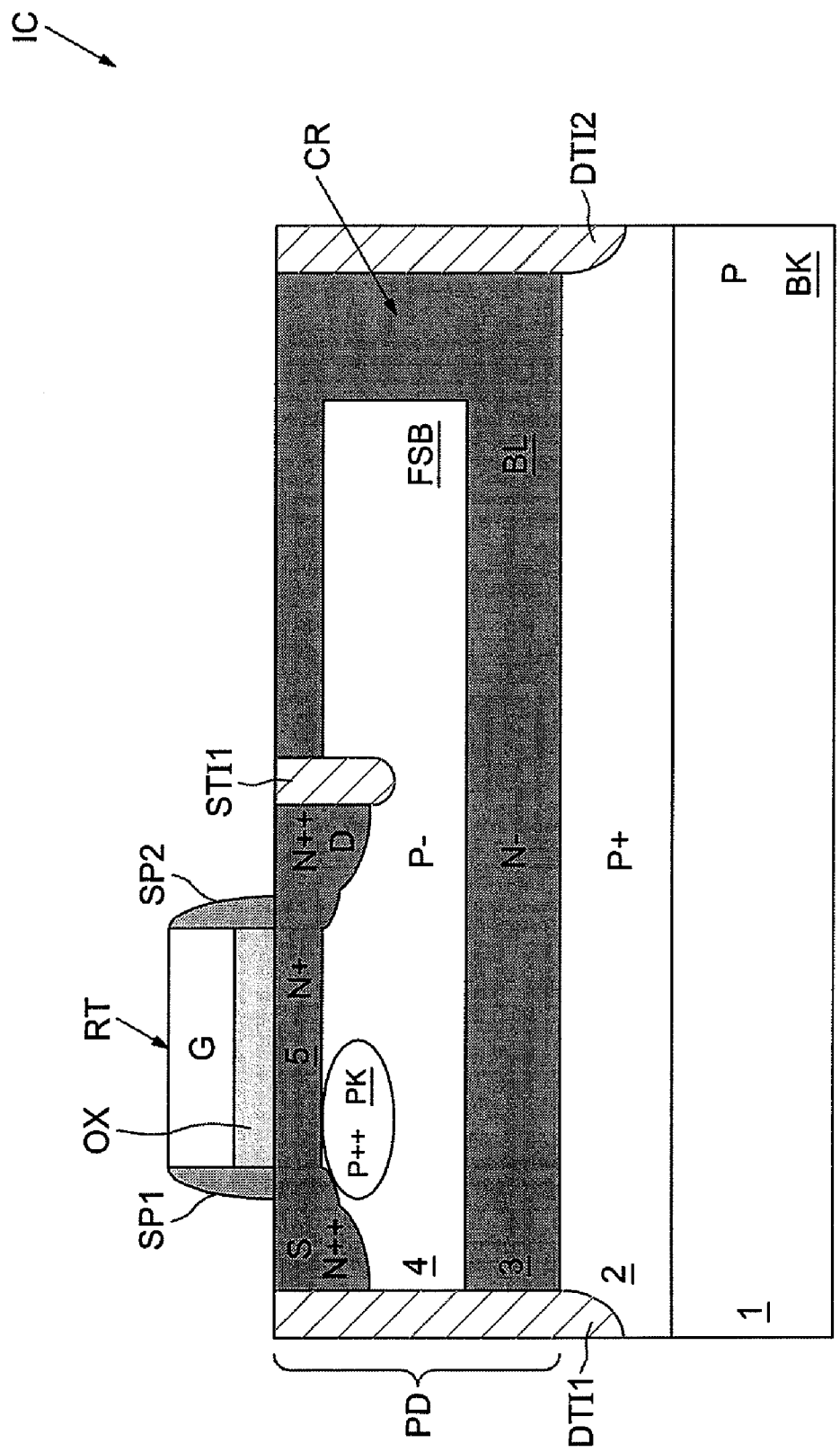
FIG. 3 shows another embodiment of an integrated circuit according to the invention.

FIG. 3 shows another embodiment of the integrated circuit IC. In this figure, the integrated circuit includes a first auxiliary isolating trench STI1, whose purpose is to optimize the area of the integrated circuit IC on silicon, as described below.

The trench STI1 is preferably of the shallow trench isolation type and is filled with silicon oxide. The isolating trench STI1 passes through the upper layer 5 so as to isolate the drain 1 of the read transistor RT (in the first portion) from a second portion of the upper layer 5 producing the photodiode PD. This makes it possible to produce a more compact integrated circuit on silicon, as described below.

Figure 4:
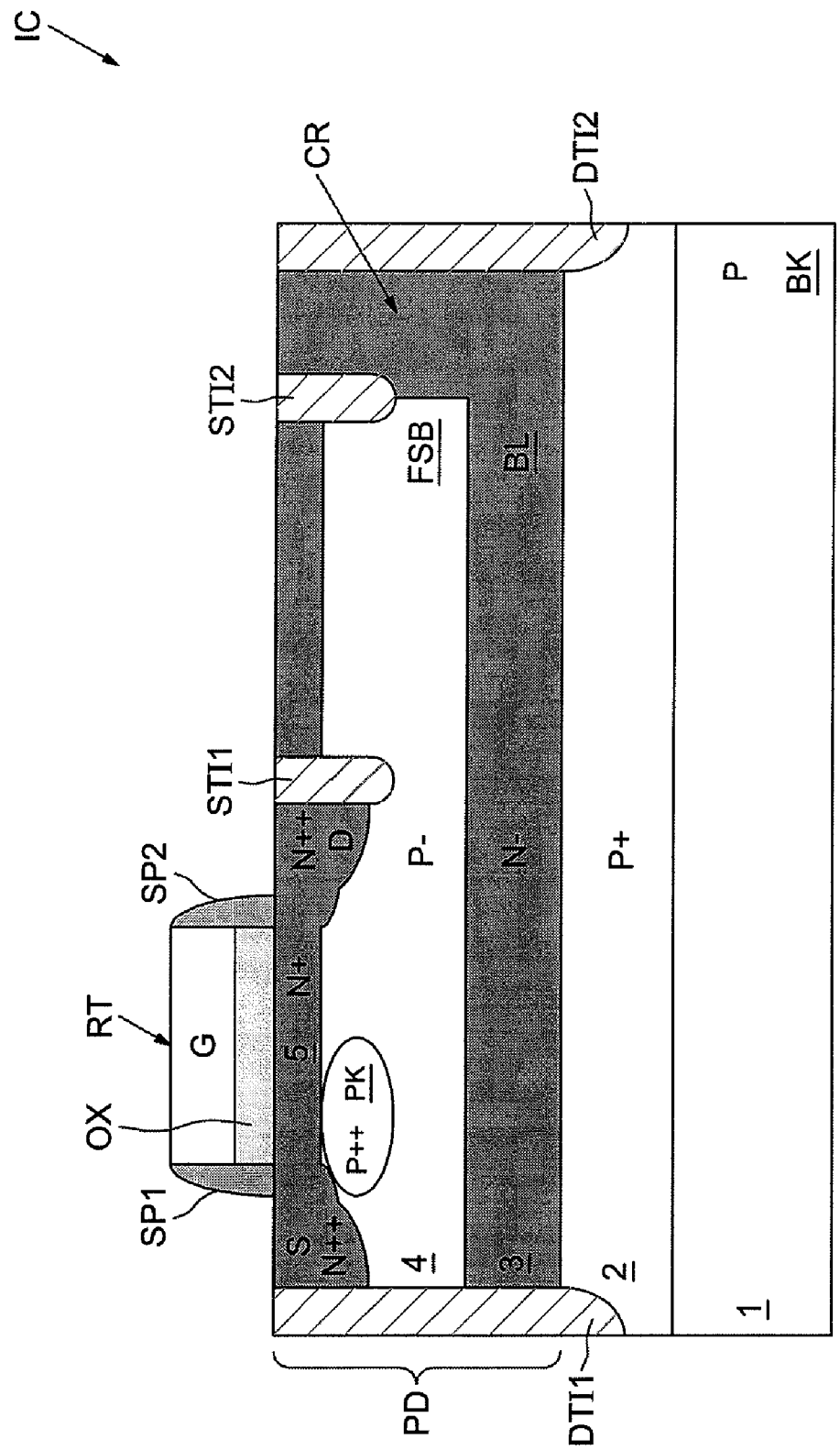
FIG. 4 shows another embodiment of an integrated circuit according to the invention.

In this case, as illustrated in FIG. 4, the integrated circuit IC may furthermore include a region CR for making contact with the buried layer BL. The circuit IC then includes a second isolating trench STI2 of the shallow trench isolation type. This isolation allows the buried layer BL to be separated from the second portion of the upper layer 5. Thus, it is possible to bias the buried layer BL independently of the drain D.

One example of a process for fabricating the integrated circuit shown in FIG. 4 will now be illustrated by FIGS. 5 to 12.

Figure 5:
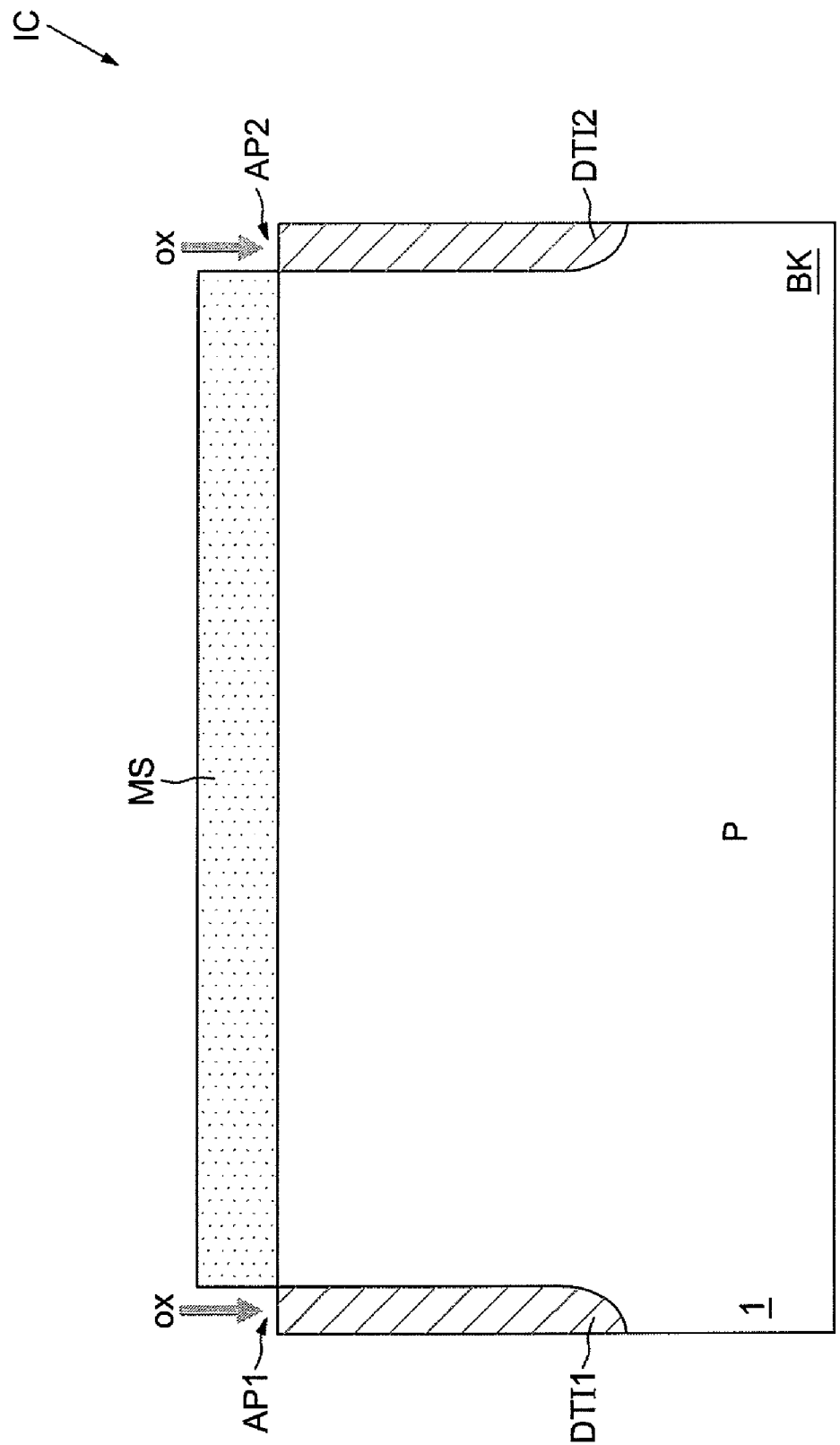
FIGS. 5 to 12 illustrate schematically the main steps of an example of a process for fabricating an integrated circuit according to the invention.
Figure 6:
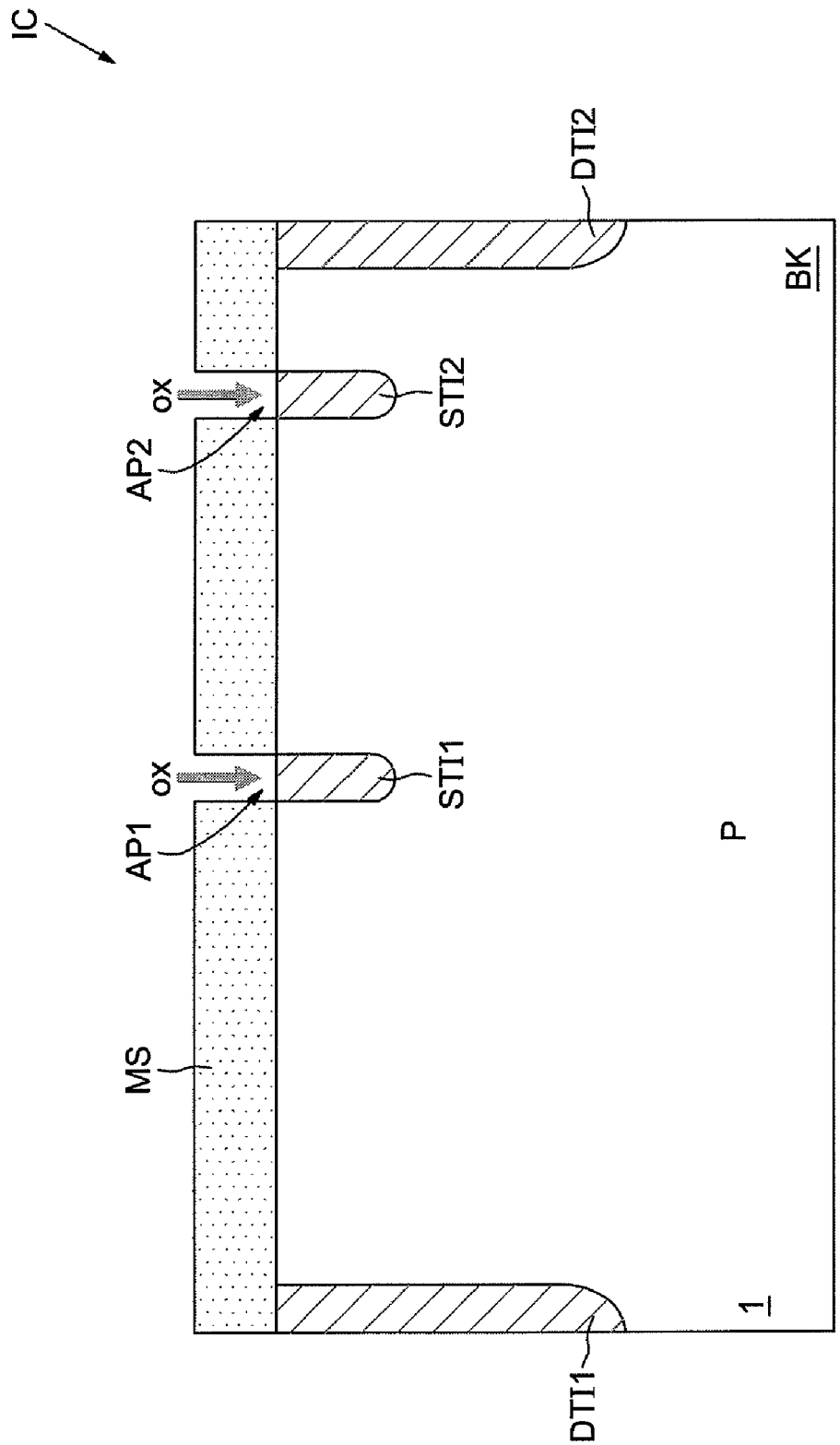
Figure 7:
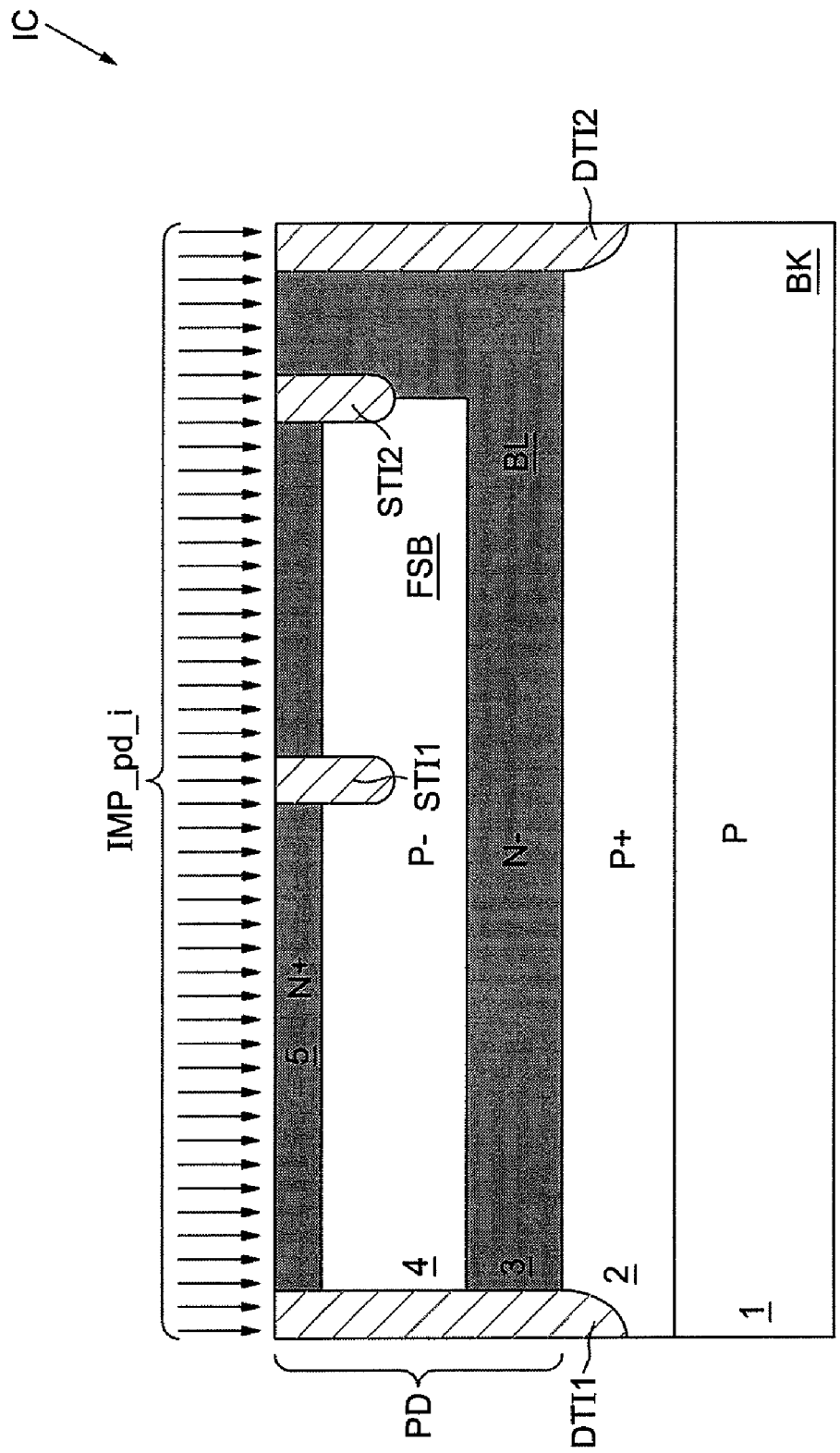
Figure 8:
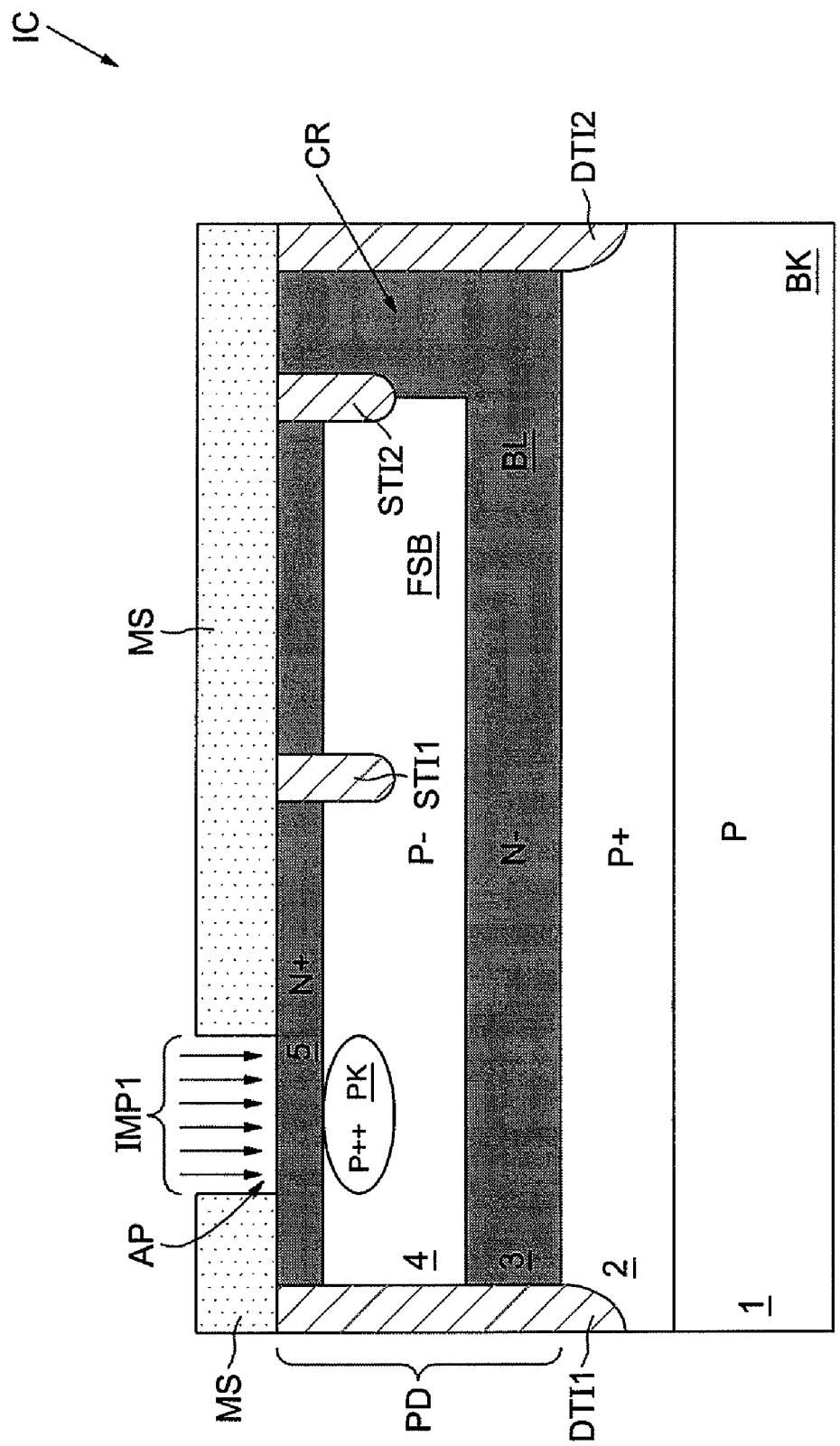
Figure 9:
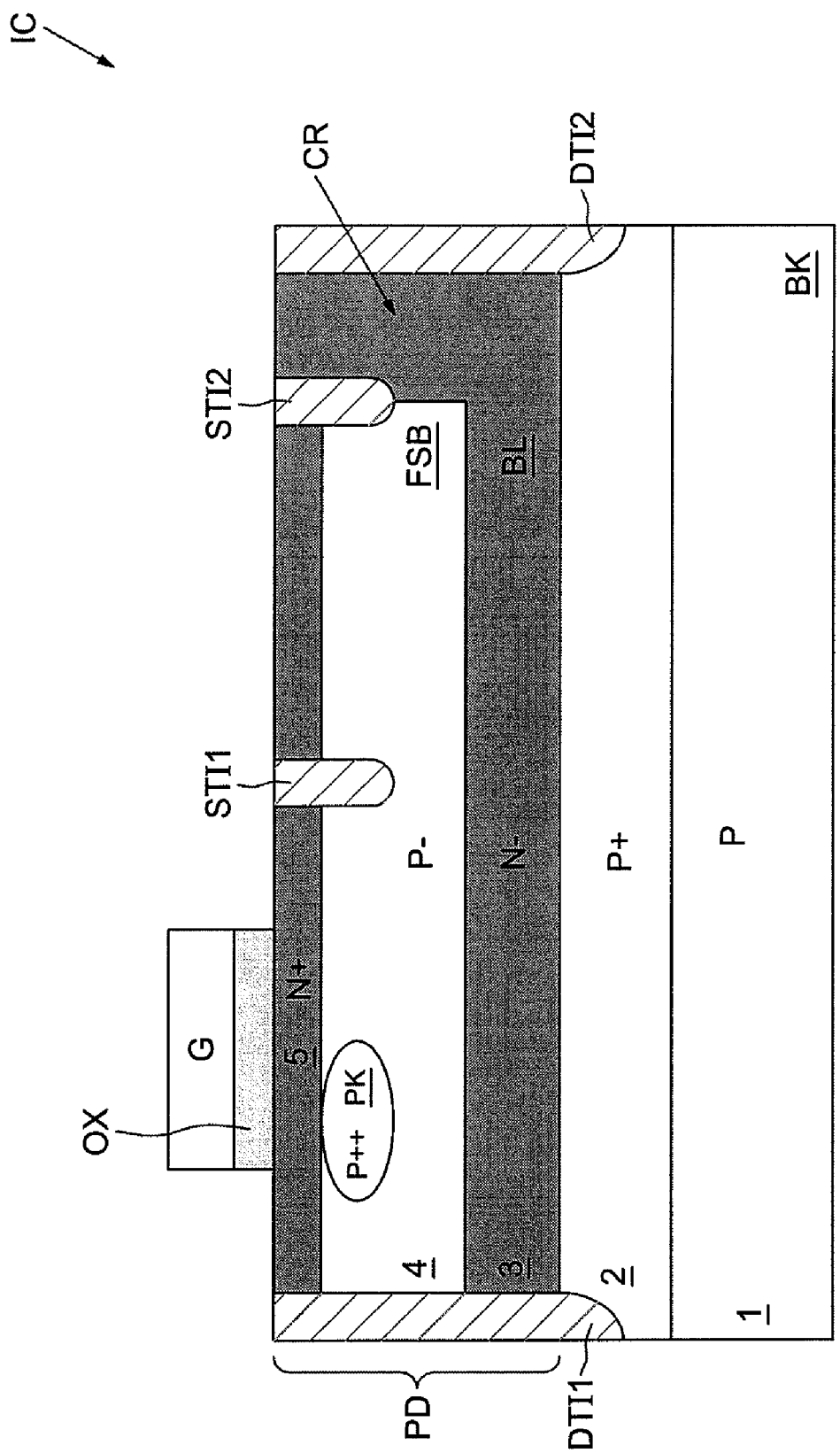
Figure 10:
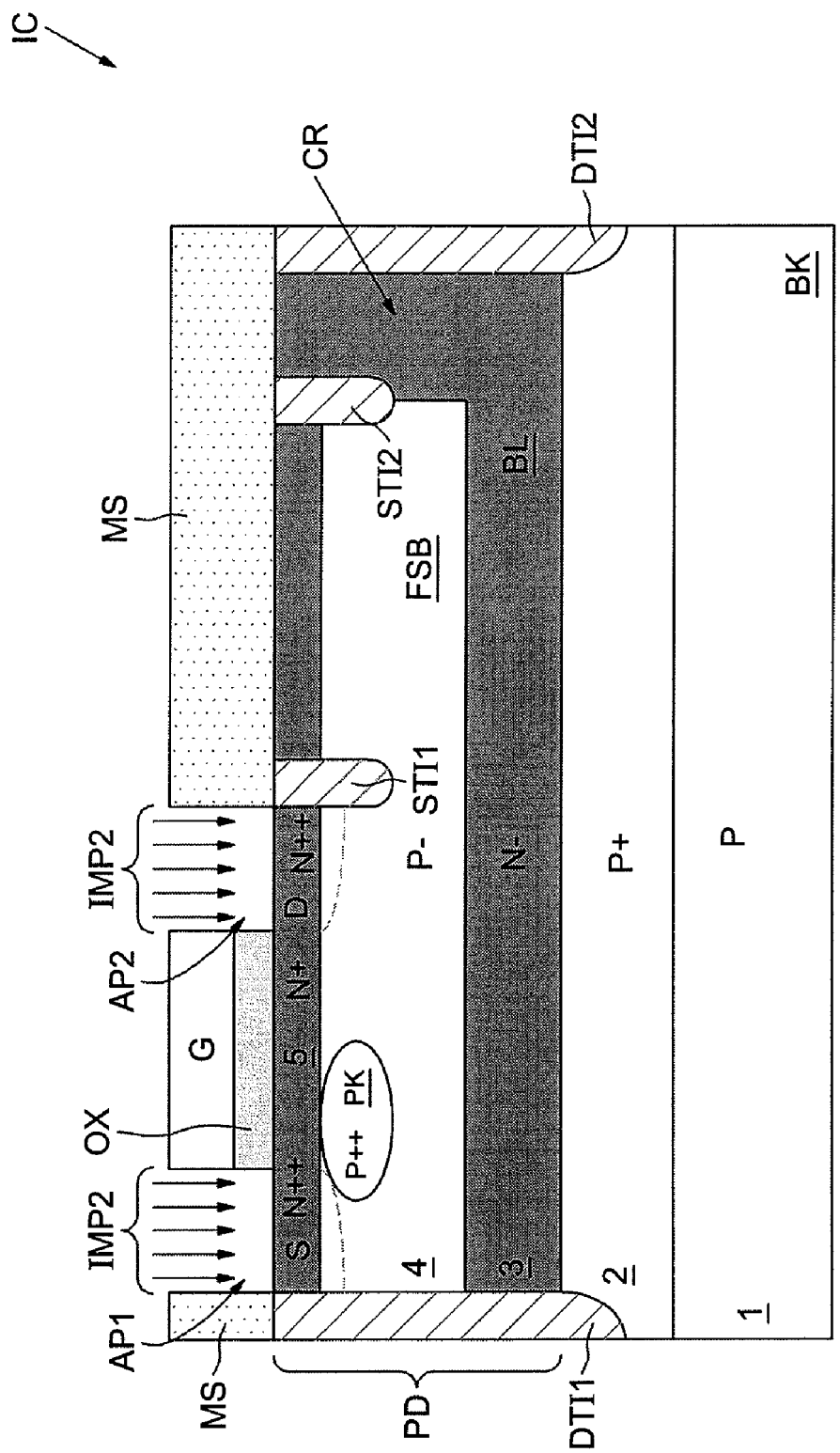
Figure 11:
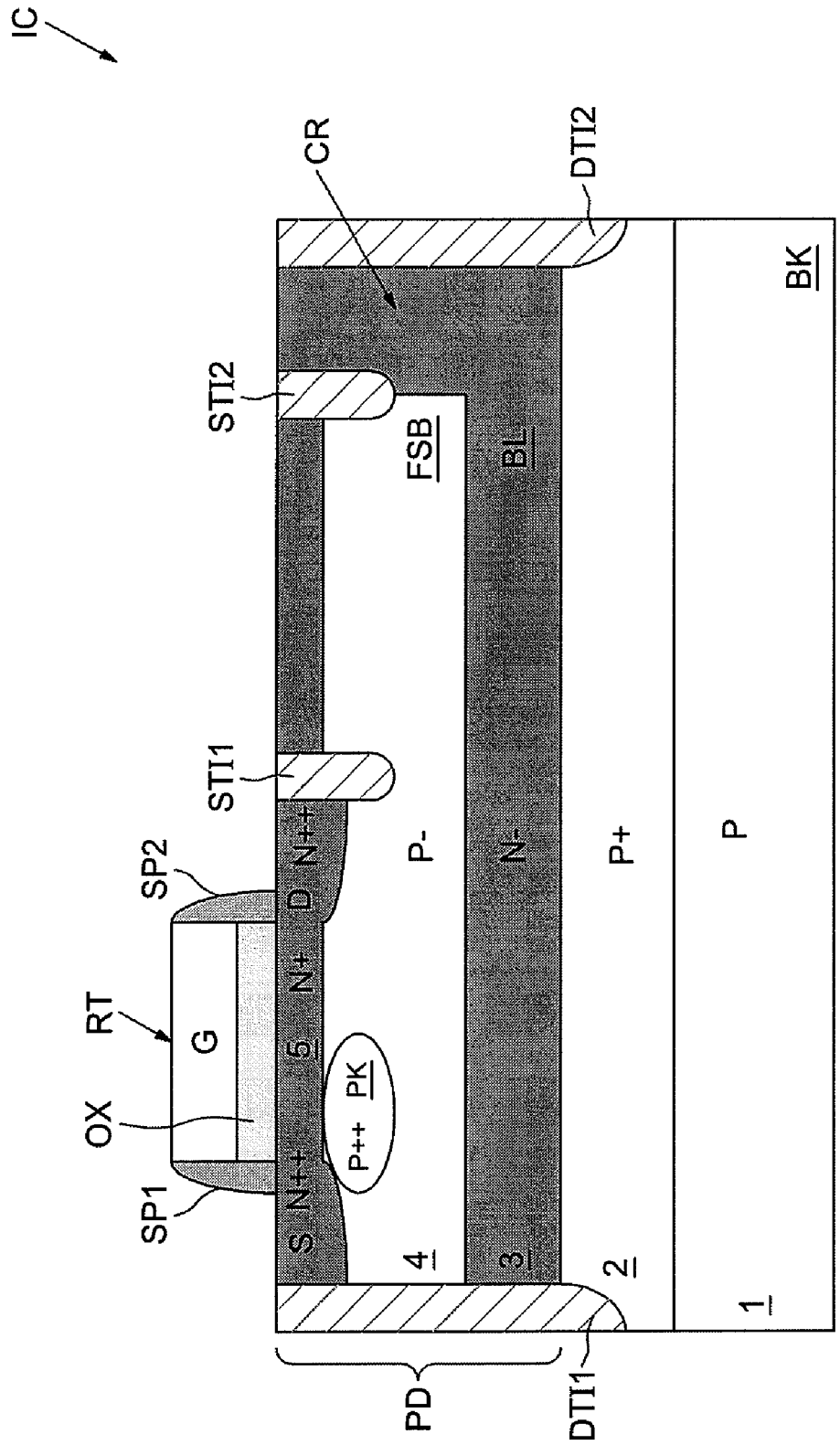
Figure 12:
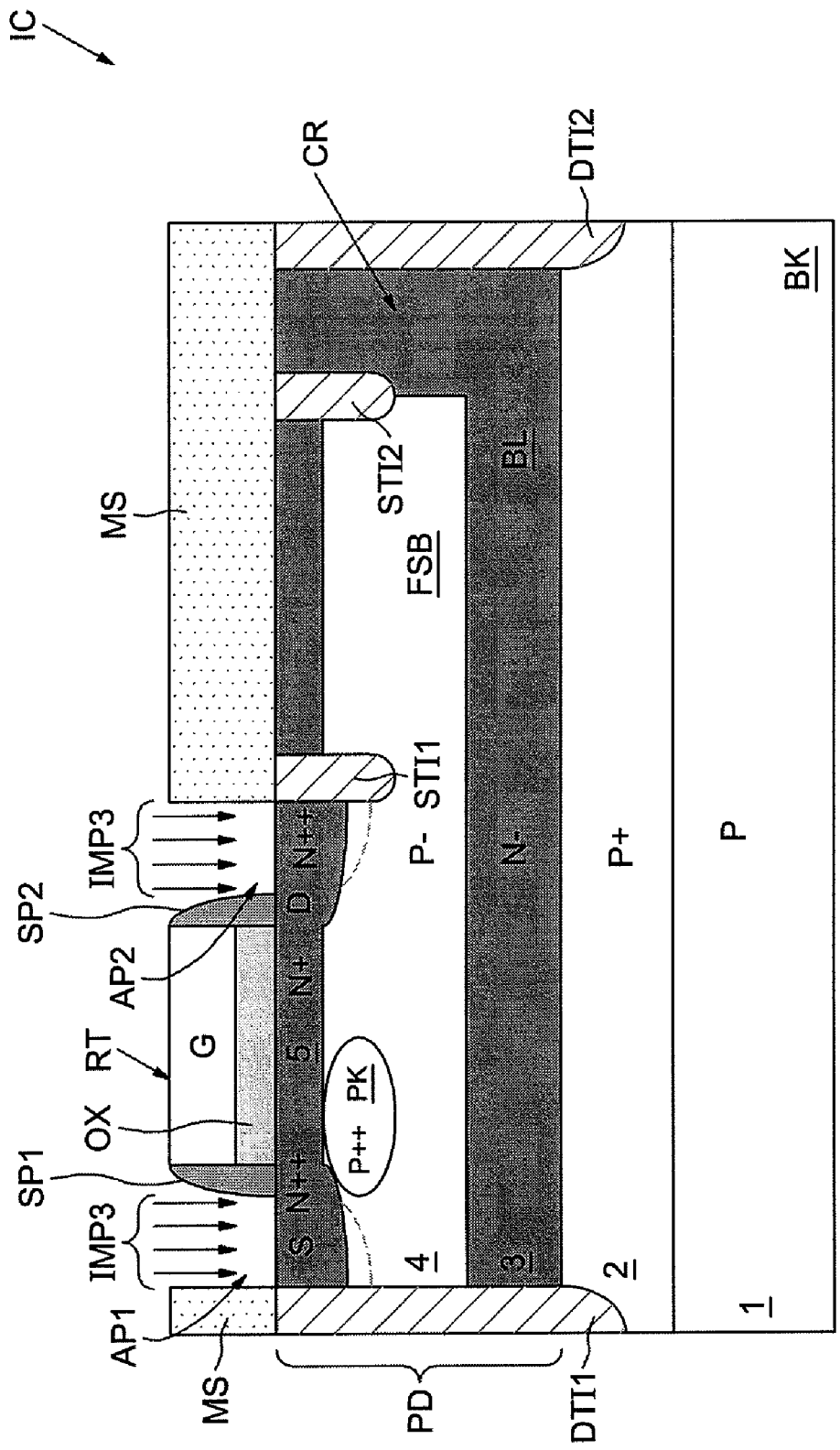

As illustrated in FIG. 5, the layer 1 is grown epitaxially using a technique well known to those skilled in the art, so as to produce the bulk BK of the integrated circuit IC.

Next, a resist layer is deposited on the layer 1. Two apertures AP1 and AP2 located at the ends of the layer 1 are then defined by etching the resist. A resist mask MS is consequently produced on the layer 1 where only the apertures AP1 and AP2 resulting from etching the resist remain at each end.

Two trenches DTI1 and DTI2 are then formed at the two apertures AP1 and AP2. The production of the trenches comprises in particular the etching of the layer 1 using a technique well known to those skilled in the art. For example, in 120 nm technology, the trenches DTI1 and DTI2 may have a depth of between 1 and 1.5 µm.

These trenches are filled with an insulation OX, for example silicon oxide. An annealing operation is then carried out for 90 minutes at a temperature of 1050° C.

The first resist mask MS is then removed.

A new resist mask MS with two new apertures AP1 and AP2 (see FIG. 6) are produced in order to form the two isolating trenches STI1 and STI2.

The new resist mask and the isolating trenches are produced as described above.

The depth of the auxiliary isolating trenches STI1 and STI2 is much less than that of the isolating trenches DTI1 and DTI2. For example, in 120 nm technology, this depth is around 0.3 µm. After filling with oxide, an annealing operation is carried out at a temperature of around 1050° C. for 90 minutes.

Thus, it will be noted that the isolating trenches DTI1, DTI2, STI1 and STI2 are produced at the start of the process. This is because the various annealing operations that are needed require high temperatures for a relatively long time. If they were to be produced in the middle of the process, there would be a risk of the dopants diffusing between the various layers of the integrated circuit IC.

After the isolating trenches have been formed, the process continues (FIG. 7) with successive implantations IMP_pd_i in the layer 1 to produce the $p^+$-doped semiconductor layer 2 and the various layers 3, 4 and 5 that form the photodiode PD.

The layer 3 of the photodiode PD, here n-doped, defines the buried layer BL. The middle layer 4, here $p^-$-doped, serves to form the floating substrate FSB of the photodiode PD. It is thus surrounded by the buried layer BL and the upper layer 5, here $n^+$-doped, produced on top of the layer 4.

The layer 4 serving to produce the floating substrate FSB is consequently entirely surrounded by semiconductor materials of an opposite conductivity type.

The various implantations may be carried out without using a mask other than protective masks for certain parts of the integrated circuit and a mask so that the floating substrate FSB is surrounded by a semiconductor layer of an opposite conductivity type. This is because the successive implantations IM_pd_i are directly self-aligned with respect to the various trenches DTI1, DTI2, STI1 and STI2 which do not require protective masks since they are filled with oxide. Thus any uncertainty associated with the masking is eliminated.

Next, (FIG. 8), a $p^{++}$-overdoped pocket PK is produced by an implantation IMP1 through an aperture AP made in a mask MS. It would be possible for this pocket PK not to be produced and for the photogenerated charges to be stored directly within the floating substrate FSB.

Next, (FIG. 9), the gate G of the read transistor RT separated from the upper layer 5 by an oxide layer OX is conventionally produced.

Next, (FIG. 10), the source and drain regions on each side of the gate G, of rectangular type, are produced by another implantation IMP2 through two new apertures AP1 and AP2 produced in a mask MS.

Next, (FIG. 11), two spacers SP1 and SP2 are conventionally formed in a manner known per se on each side of the gate G of the read transistor RT.

It is possible to carry out (FIG. 12) a new implantation of dopants IMP3 into the source and drain regions S and D. The implantation of dopants IMP3 takes place via two new apertures AP1 and AP2 produced in a mask MS, on each side of the gate G.

Figure 13:
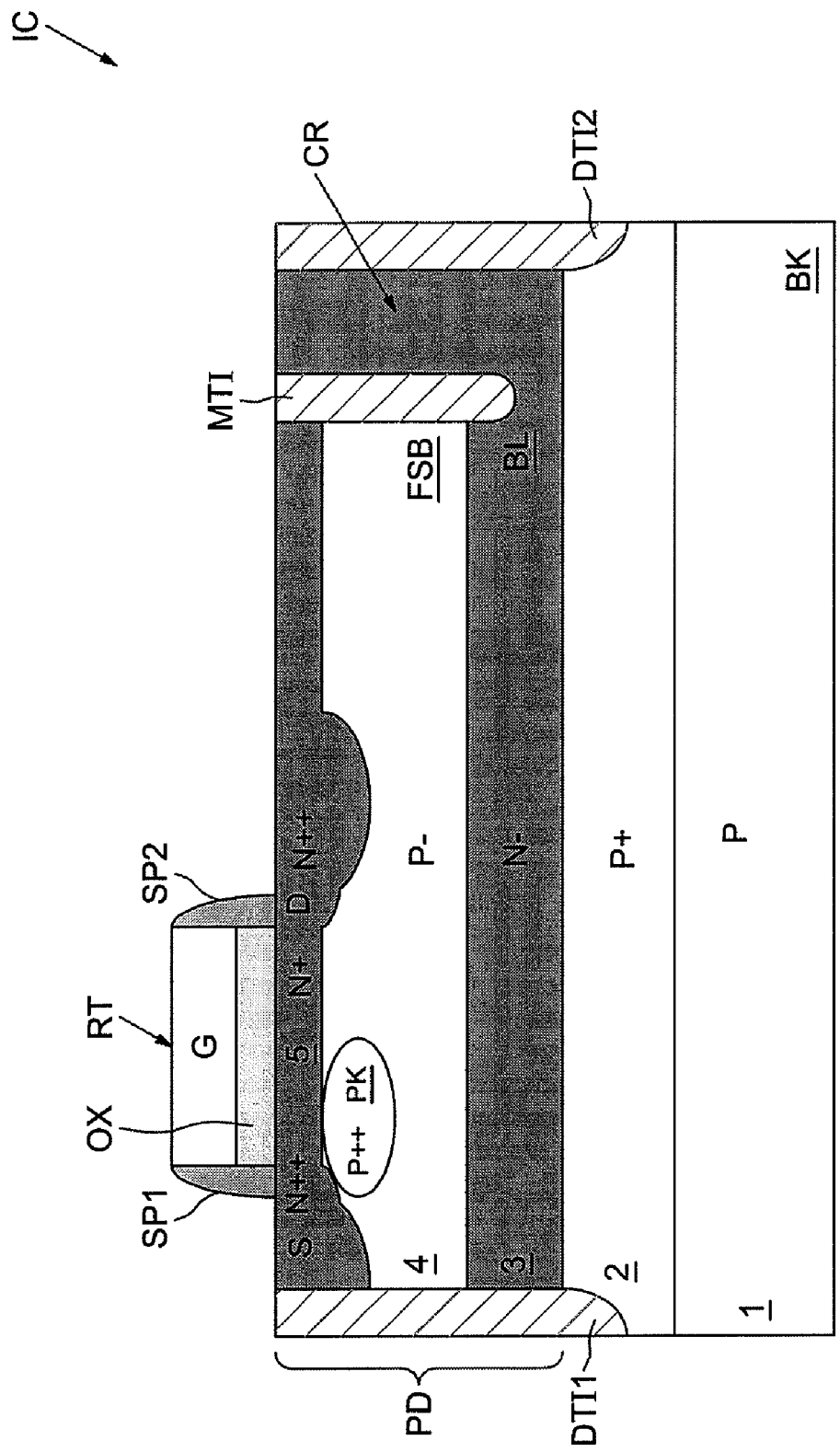
FIG. 13 shows another embodiment of an integrated circuit according to the invention.

FIG. 13 shows another embodiment of the integrated circuit according to the invention. This embodiment no longer includes the two auxiliary isolating trenches STI1 and STI2, but does retain a contact region CR on the buried layer BL. To isolate the contact region CR from the upper layer 5 sufficiently to prevent the diffusion of dopants being able to take place during the various annealing operations of the fabrication process, the integrated circuit includes, between the contact region CR and the floating substrate FSB, another isolating trench MTI. This isolating trench is preferably of the medium trench isolation type. This isolating trench MTI extends down to the buried layer BL so as to completely separate the floating substrate FSB from the contact region CR.

It is possible to produce the integrated circuit according to the invention on silicon with various topologies. Two possible configurations are given below by way of example, these being in no way limiting.

Figure 14:
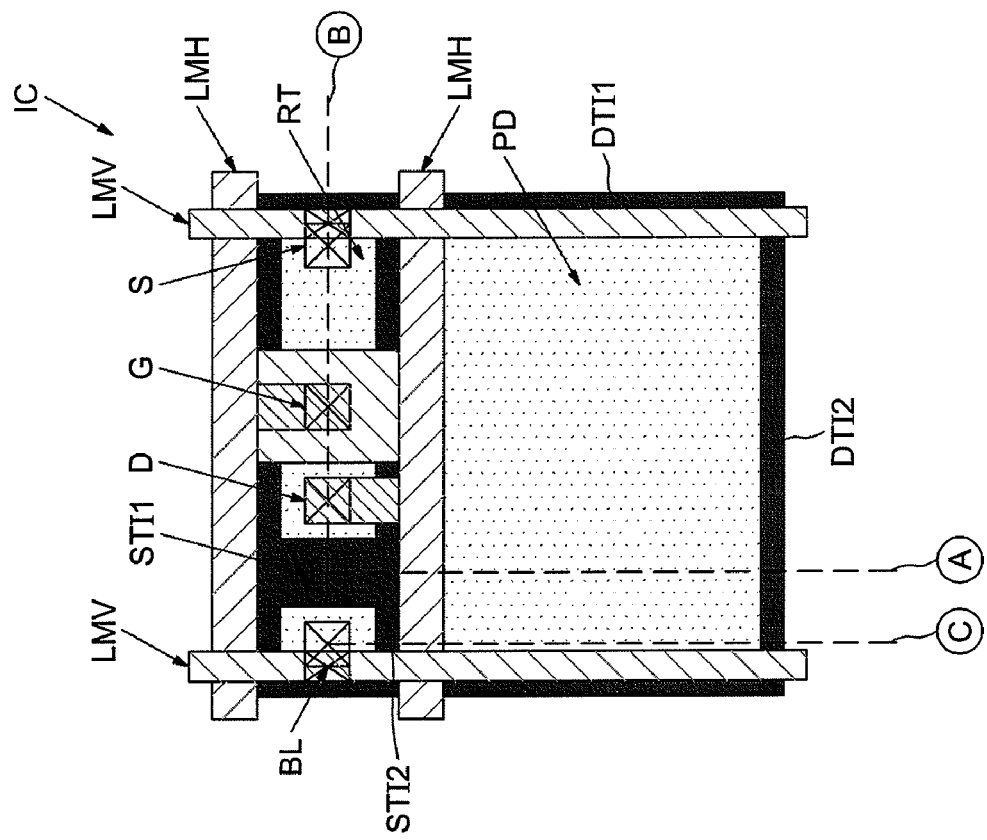

For example, FIG. 14 shows the photodiode PD surrounded by an isolating layer of DTI type, which corresponds to the deep isolating trench DTI2 for isolating two pixels belonging to two different adjacent lines and the deep isolating trench DTI1 so as to further isolate the photodiode PD region from the buried layer BL, as may be seen by following the dotted line B.

The read transistor RT is produced in compact form on part of the integrated circuit IC. It includes a gate G of rectangular cross section, either side of which are again the drain and source, D and S respectively. Horizontal and vertical metal lines LMH and LMV are provided.

The drain region D is separated from the photodiode PD by an isolating trench STI1 of the photodiode PD, as may be seen by following the dotted line A. Moreover, the buried layer is isolated from the photodiode PD by the second auxiliary trench STI2, so as to produce a point of contact on the buried layer BL, as may be seen by following the dotted line C.

An integrated circuit comprising four separate cells CL1, CL2, CL3 and CL4 (for example pixels) is shown in FIG. 15.

These cells are distributed along two different lines L1 and L2, isolated from each other by DTI-type isolations.

So as to produce a single contact point on the buried layer for the pixels belonging to any one line, an MTI-type isolating trench is produced between each pixel so as to isolate each of the floating substrates without cutting the buried layer. In this way, it is possible to produce a contact region for the buried layer BL at the end (or at both ends) of each of the lines and not for each pixel.

Although preferred embodiments of the method and apparatus of the present invention have been illustrated in the accompanying Drawings and described in the foregoing Detailed Description, it will be understood that the invention is not limited to the embodiments disclosed, but is capable of numerous rearrangements, modifications and substitutions without departing from the spirit of the invention as set forth and defined by the following claims.

What is claimed is:

1. An integrated circuit, comprising:
    at least one photodiode of the floating substrate type associated with a read transistor, said photodiode comprising a buried layer lying beneath a floating substrate and an upper layer lying on the floating substrate which incorporates a source region and a drain region of the read transistor,
    wherein the source and drain regions are produced on either side of a gate of the read transistor; and
    an isolating trench located alongside said source region and extending from an upper surface of the upper layer down to below the buried layer, so as to isolate the source region from said buried layer.

2. The integrated circuit according to claim 1, further including a semiconductor contact region of a same conductivity type as the buried layer and electrically isolated from the upper layer, said contact region extending between the upper surface of the upper layer and the buried layer.

3. The integrated circuit according to claim 1, further including a first auxiliary isolating trench lying between the drain region of the transistor and the photodiode and passing through said upper layer.

4. The integrated circuit according to claim 3, further including:
    a semiconductor contact region of a same conductivity type as the buried layer and electrically isolated from the upper layer and in contact with the buried layer, and
    a second auxiliary isolating trench lying between the photodiode and said semiconductor contact region which passes through said upper layer.

5. The integrated circuit according to claim 3, further including
    a semiconductor contact region of a same conductivity type as the buried layer and electrically isolated from the upper layer, and
    a second auxiliary isolating trench lying between the photodiode and the semiconductor contact region and extending from the upper surface of the upper layer down to below an upper surface of the floating substrate.

6. An integrated circuit, comprising:
    a plurality of photodiodes, each photodiode of the floating substrate type comprising a buried layer lying beneath a floating substrate and an upper layer lying on the floating substrate;
    a read transistor associated with each photodiode including source and drain regions incorporated into the upper layer and produced on either side of a gate of the read transistor; and
    a first isolating trench located alongside said source region of each read transistor and extending from an upper surface of the upper layer down to below the buried layer, so as to isolate the source region from said buried layer.

7. The integrated circuit of claim 6 wherein the read transistor and associated photodiode form a photodiode/transistor circuit, further including a second isolating trench located between adjacent photodiode/transistor circuits and extending from an upper surface of the upper layer down to below the buried layer, so as to isolate the adjacent photodiode/transistor circuits from each other.

8. The integrated circuit of claim 6 wherein each adjacent photodiode/transistor circuit defines a pixel of an image sensor.

9. The integrated circuit of claim 6 further comprising:
    a semiconductor contact region of a same conductivity type as the buried layer extending from an upper surface of the integrated circuit down to contact with the buried layer; and
    a second isolating trench positioned between the semiconductor contact region and the upper layer and extending from an upper surface of the upper layer down to the floating substrate.

10. The integrated circuit of claim 9 further including a third isolating trench positioned between the drain region and the photodiode and extending from an upper surface of the upper layer down to the floating substrate.

11. An integrated circuit, comprising:
    a photodiode of the floating substrate type comprising a buried layer lying beneath a floating substrate and an upper layer lying on the floating substrate, the upper layer including a first portion and a second portion;
    a read transistor associated with the photodiode including source and drain regions incorporated into the first portion of the upper layer and produced on either side of a gate of the read transistor; and
    a first trench isolation structure extending through the upper layer and into the floating substrate, the first trench isolation structure dividing the upper layer into the first and second portions.

12. The integrated circuit of claim 11 further comprising a semiconductor contact region of a same conductivity type as the buried layer extending from an upper surface of the integrated circuit which is adjacent the second portion of the upper layer down to contact with the buried layer.

13. The integrated circuit of claim 12 further comprising:
a second trench isolation structure located alongside said source region and extending from an upper surface of the upper layer down to below the buried layer, so as to isolate the source region from said buried layer; and
a third trench isolation structure located alongside the semiconductor contact region and extending from an upper surface of the upper layer down to below the buried layer.

14. The integrated circuit as in claim 11 further including an over-doped pocket of a same conductivity type as the floating substrate located within the floating substrate underneath the gate of the read transistor and between the source and drain regions.

15. An integrated circuit, comprising:
a photodiode of the floating substrate type comprising a buried layer lying beneath a floating substrate and an upper layer lying on the floating substrate, the upper layer including a first portion and a second portion;
a read transistor associated with the photodiode including source and drain regions incorporated into the first portion of the upper layer and produced on either side of a gate of the read transistor;
a first trench isolation structure extending through the upper layer and into the floating substrate, the first trench isolation structure dividing the upper layer into the first and second portions;
a semiconductor contact region of a same conductivity type as the buried layer extending down to contact with the buried layer; and
a second trench isolation structure extending through the upper layer and into the floating substrate, the second trench isolation structure dividing the second portion of the upper layer from the semiconductor contact region.

16. The integrated circuit of claim 15 further comprising:
a third trench isolation structure located alongside said source region and extending from an upper surface of the upper layer down to below the buried layer, so as to isolate the source region from said buried layer; and
a fourth trench isolation structure located alongside the semiconductor contact region and extending from an upper surface of the upper layer down to below the buried layer.

17. The integrated circuit as in claim 15 further including an over-doped pocket of a same conductivity type as the floating substrate located within the floating substrate underneath the gate of the read transistor and between the source and drain regions.

18. An integrated circuit, comprising:
a photodiode of the floating substrate type comprising a buried layer lying beneath a floating substrate and an upper layer lying on the floating substrate, the upper layer including a first portion and a second portion;
a read transistor associated with the photodiode including source and drain regions incorporated into the first portion of the upper layer and produced on either side of a gate of the read transistor;
a semiconductor contact region of a same conductivity type as the buried layer extending down to contact with the buried layer; and
a first trench isolation structure extending through the upper layer and floating substrate at least to an upper surface of the buried layer, the first trench isolation structure separating the second portion of the upper layer from the semiconductor contact region.

19. The integrated circuit of claim 18 further comprising:
a second trench isolation structure located alongside said source region and extending from an upper surface of the upper layer down to below the buried layer, so as to isolate the source region from said buried layer; and
a third trench isolation structure located alongside the semiconductor contact region opposite the first trench isolation structure and extending from an upper surface of the upper layer down to below the buried layer.

20. The integrated circuit as in claim 18 further including an over-doped pocket of a same conductivity type as the floating substrate located within the floating substrate underneath the gate of the read transistor and between the source and drain regions.

* * * * *